United States Patent [19]
Schuele et al.

[11] Patent Number: 5,717,250
[45] Date of Patent: Feb. 10, 1998

[54] SPUTTER AND CVD DEPOSITED TITANIUM NITRIDE BARRIER LAYER BETWEEN A PLATINUM LAYER AND A POLYSILICON PLUG

[75] Inventors: Paul J. Schuele; Pierre C. Fazan, both of Boise, Id.

[73] Assignee: Micron Technology, Inc., Boise, Id.

[21] Appl. No.: 614,798

[22] Filed: Mar. 7, 1996

Related U.S. Application Data

[62] Division of Ser. No. 290,655, Aug. 15, 1994, abandoned.
[51] Int. Cl.$^6$ .................. H01L 23/48; H01L 23/52
[52] U.S. Cl. ............... 257/754; 257/760; 257/764; 257/769; 257/770
[58] Field of Search ................ 257/754, 760, 257/763, 764, 770, 769, 751, 753, 767

[56] References Cited

U.S. PATENT DOCUMENTS

| | | | |
|---|---|---|---|
| 5,089,438 | 2/1992 | Katz | 437/184 |
| 5,136,362 | 8/1992 | Grief | 357/67 |
| 5,246,881 | 9/1993 | Sandhu | 437/192 |
| 5,252,518 | 10/1993 | Sandhu | 437/200 |
| 5,254,499 | 10/1993 | Sandhu et al. | 437/192 |
| 5,258,096 | 11/1993 | Sandhu et al. | 156/643 |
| 5,292,677 | 3/1994 | Dennison | 437/52 |
| 5,335,138 | 8/1994 | Sandhu | 361/303 |
| 5,336,629 | 8/1994 | Dohng et al. | 437/52 |
| 5,344,792 | 9/1994 | Sandhu | 437/200 |
| 5,381,302 | 1/1995 | Sandhu et al. | 361/305 |

FOREIGN PATENT DOCUMENTS 1-266718 (A) 10/1989 Japan ................ H01L 21/28

OTHER PUBLICATIONS

IBM Technical Disclosure Bulletin, vol. 35, No. 5, Oct. 1992 (Collimated Sputtering).

*Primary Examiner*—Tom Thomas
*Assistant Examiner*—David Ostrowski
*Attorney, Agent, or Firm*—Angus C. Fox, III

[57] ABSTRACT

This invention is a process for forming an effective titanium nitride barrier layer between the upper surface of a polysilicon plug formed in thick dielectric layer and a platinum lower capacitor plate in a dynamic random access memory which is being fabricated on a silicon wafer. The barrier layer process begins by etching the upper surface of the polysilicon plug using a selective polysilicon etch until it is recessed at least 1000 Å below the upper surface of the thick dielectric layer. Using a collimated sputter source, a titanium layer having a thickness of 100–500 Å is deposited over the surface of the in-process wafer, thus covering the upper surfaces of the polysilicon plugs. A layer of amorphous titanium carbonitride having a thickness of 100–300 Å is then deposited via low-pressure chemical vapor deposition. This is followed by the deposition of a reactively sputtered titanium nitride layer having a thickness of 1000–2000 Å. The wafer is then planarized to remove the titanium, titanium carbonitride and titanium nitride, except that which is in the recesses on top of the silicon plugs. The wafer is then annealed in nitrogen to react the titanium layer with the silicon on the upper surfaces of the plugs to form titanium silicide. A platinum layer is then deposited and patterned to form lower capacitor electrodes which are electrically coupled to the polysilicon plugs through the titanium silicide, titanium nitride and titanium carbonitride layers.

29 Claims, 3 Drawing Sheets

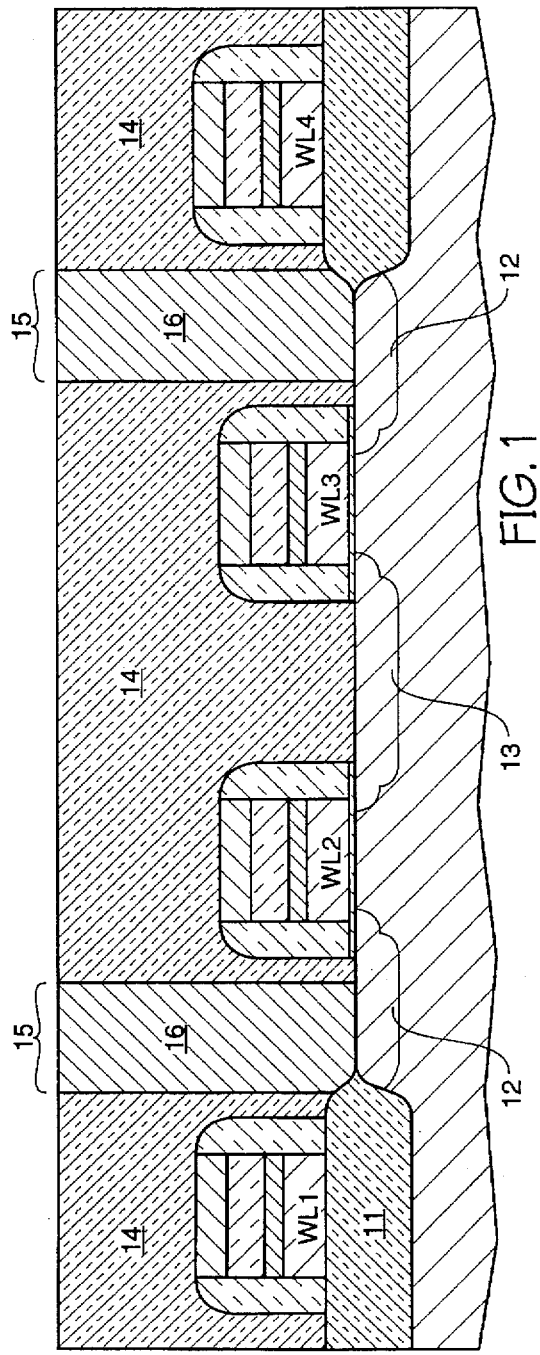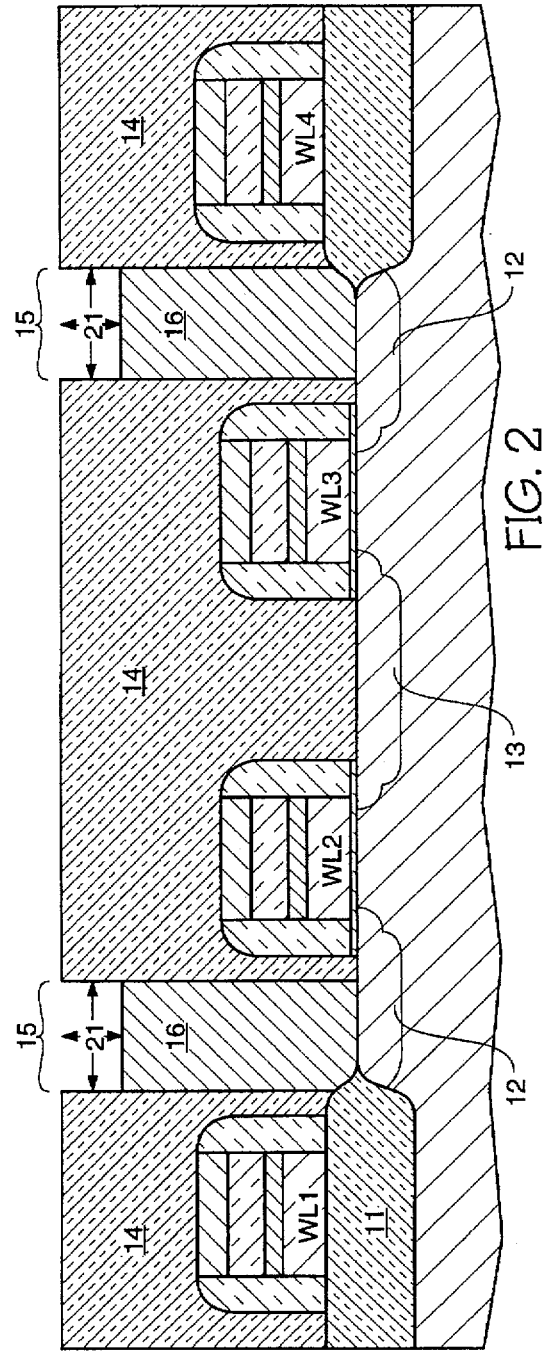

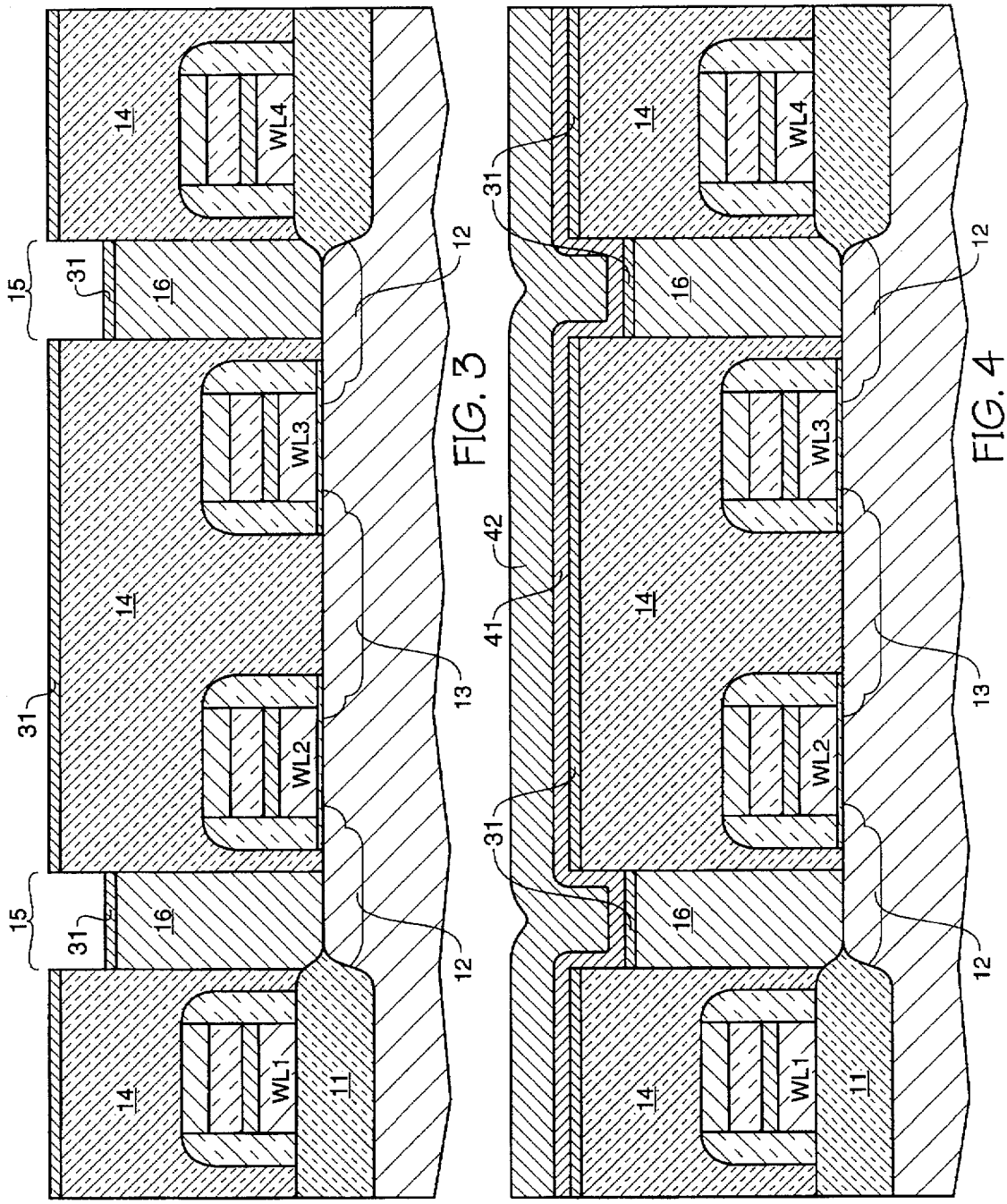

SPUTTER AND CVD DEPOSITED TITANIUM NITRIDE BARRIER LAYER BETWEEN A PLATINUM LAYER AND A POLYSILICON PLUG

This is a Divisional of application Ser. No. 08/290,655 filed on Aug. 15, 1994 now abandoned.

This invention was made with Government support under Contract No. MDA972-93-C-0033 awarded by Advanced Research Projects Agency (ARPA). The Government has certain rights in this invention.

FIELD OF THE INVENTION

This invention relates to the manufacture of integrated circuits and, more specifically, to barrier films which are employed to prevent atomic and ionic migration between two adjacent layers which must be conductively coupled.

BACKGROUND OF THE INVENTION

For a particular design of an ultra-high-density dynamic random access memory, the integration of a capacitor having a high-permittivity dielectric layer in a CMOS process flow requires that contact be made between a platinum lower capacitor plate and a polycrystalline silicon (polysilicon) plug which makes contact to the storage node junction of the cell access transistor. The dielectric layer, which may be a perovskite oxide such as barium strontium titanate, is deposited at high temperatures in an oxygen ambient.

There are two problems inherent to the dielectric deposition process. The first problem is that the high temperature required for the deposition will initiate a silicidation reaction between platinum and silicon, thus consuming the platinum capacitor plate and contaminating the capacitor with silicon. It is therefore necessary to utilize an electrically conductive diffusion barrier between the platinum and the polysilicon. The second problem is that oxygen will diffuse through the platinum layer and form an insulative silicon dioxide layer between the polysilicon plug and the platinum layer. In such a case, the lower plate of the capacitor will not be in electrical contact with the storage-node junction. Thus the diffusion barrier must also be impermeable to oxygen.

Reactively sputtered titanium nitride has been used extensively as a barrier layer in integrated circuits. However, reactively sputtered titanium nitride has a crystalline structure and does not exhibit good step coverage—particularly in deep contact openings. The crystal boundaries associated with such a structure tend to promote ionic and atomic migration. Given this fact, the polysilicon plugs will not be sufficiently protected from reaction with the platinum capacitor plate or with oxygen.

Titanium nitride deposited via low-pressure chemical vapor deposition (LPCVD) using tetra-kis-dimethylamidotitanium or related compounds as the sole precursor is an amorphous material, having no crystal structure and, therefore, no crystal grain boundaries to facilitate atomic and ionic diffusion. However, titanium nitride films deposited via LPCVD have a high carbon content. From X-Ray spectrographic analysis, it appears that some of the carbon atoms have reacted with the titanium to form titanium carbide. The balance of the carbon atoms appear to be unreacted, but trapped nevertheless in the titanium nitride/titanium carbide matrix. It is hypothesized that a crystalline structure fails to form because the presence of carbon interferes with crystal nucleation. The presence of carbon, though likely responsible for the amorphous structure of the film (a beneficial quality), is also problematic, as it greatly increases the sheet resistance of the film. In addition when the carbon-containing films are subjected to high temperatures in the presence of oxygen, the films become perforated and, hence, worthless as barrier films. The perforation phenomenon may be caused by the explosive formation of carbon dioxide gas within the film.

What is needed is a way to combine the beneficial qualities of both reactively-sputtered titanium nitride with those of titanium nitride deposited via LPCVD.

SUMMARY OF THE INVENTION

This invention is a process for forming an effective titanium nitride barrier layer between the upper surface of a polysilicon plug and a platinum lower capacitor plate in a dynamic random access memory. The memory, which is fabricated on a silicon wafer or substrate, has insulated gate field effect cell access transistors with polysilicon gates which may have a layer of a refractory metal silicide (e.g., tungsten silicide) on their upper surfaces to lower sheet resistance. The transistors are covered with a planarized, thick, flowably deposited dielectric layer such as borophospho-silicate glass (BPSG). A via or contact opening is etched through the thick (the term "thick" is employed merely to distinguish this dielectric layer from the subsequently-deposited capacitive dielectric layer) to the storage-node junction of each access transistor, and each of these openings is filled with a polysilicon plug. To begin the barrier layer formation process, the upper surface of each polysilicon plug is recessed at least 1000 Å below the upper surface of the thick dielectric layer using a selective polysilicon etch. Using a collimated sputter source, a titanium layer having a thickness of 100–500 Å is deposited over the surface of the in-process wafer, thus covering the upper surfaces of the polysilicon plugs. A layer of amorphous titanium carbonitride having a thickness of 100–300 Å is then deposited via low-pressure chemical vapor deposition. This is followed by the deposition of a reactively sputtered titanium nitride layer having a thickness of 1000–2000 Å. The wafer is then planarized using chemical mechanical polishing (CMP) to remove the titanium, titanium carbonitride and titanium nitride, except that which is in the recesses on top of the silicon plugs. The wafer is then annealed in nitrogen using a rapid thermal anneal system to react the titanium layer with the silicon on the upper surfaces of the plugs to form titanium silicide. The anneal step also repairs damage sustained by the titanium nitride layer during the CMP step. A platinum layer is then deposited and patterned to form lower capacitor electrodes which are electrically coupled to the polysilicon plugs through the titanium silicide, titanium nitride and titanium carbonitride layers. A high permittivity capacitor dielectric layer is then deposited and the capacitors are completed by depositing an upper cell plate layer. The memory is then completed in a conventional manner.

BRIEF DESCRIPTION OF THE DRAWINGS

FIG. 1, a cross-sectional view of a portion of an in-process semiconductor wafer, depicts a portion of a dynamic random access memory (DRAM) array following field oxidation, wordline formation, source/drain implants, deposition of a thick dielectric layer, and polysilicon plug formation;

FIG. 2 is a cross-sectional view of the portion of the in-process DRAM array of FIG. 1 following an etch selective for polysilicon which has recessed the upper surface of each plug below the upper surface of the thick dielectric layer;

FIG. 3 is a cross-sectional view of the portion of the in-process DRAM array of FIG. 2 following the deposition of a platinum metal layer;

FIG. 4 is a cross-sectional view of the portion of the in-process DRAM array of FIG. 3 following the formation of a titanium carbonitride layer via low-pressure chemical vapor deposition and the subsequent deposition of a titanium nitride layer via reactive sputtering;

PREFERRED EMBODIMENT OF THE INVENTION

Figure 5:
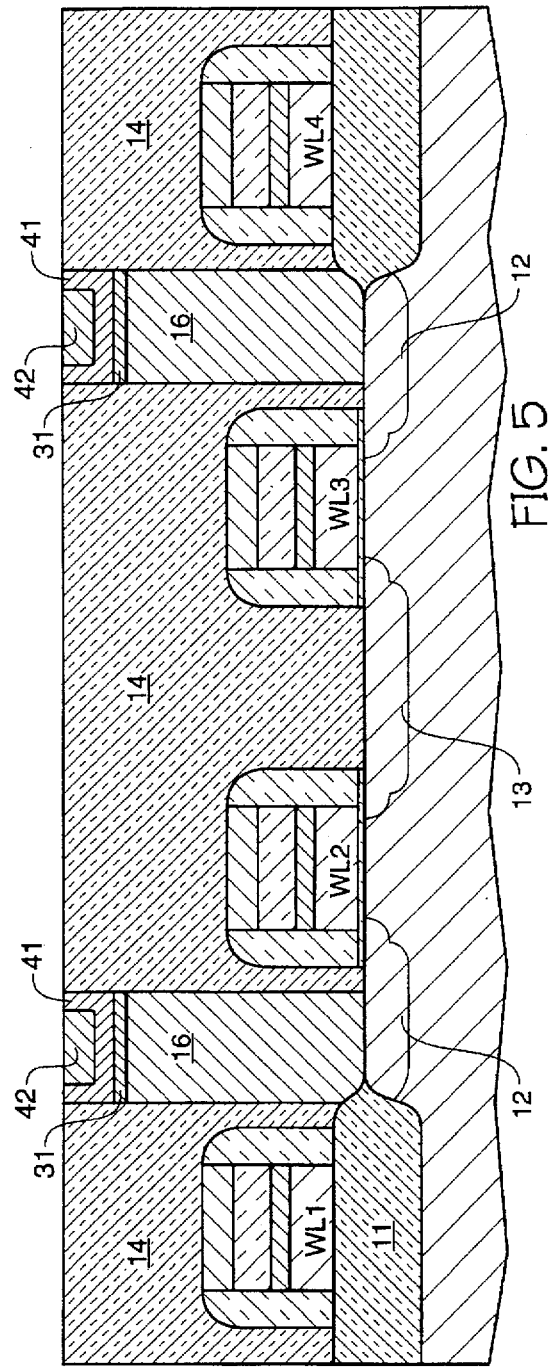
FIG. 5 is a cross-sectional view of the portion of the in-process DRAM array of FIG. 4 following a planarization step.

Referring now to FIG. 1, a portion of an in-process dynamic random access memory (DRAM) array is shown following a field oxidation step which formed field oxide regions 11, the deposition and patterning of a polysilicon layer to form wordlines WL1–WL4, source/drain implants which have formed storage-node junctions 12 and bitline contact junctions 13, the deposition of a thick, flowable dielectric layer (e.g., borophosphosilicate glass) 14 which covers substrate-superjacent topography such as wordlines and field oxide regions, the formation of contact openings 15 in the thick dielectric layer 14 which expose the storage-node junctions 12, filling the contact openings with polysilicon material, and planarization of the wafer to form polysilicon plugs 16.

Referring now to FIG. 2, the polysilicon plugs 16 have been recessed within the contact openings 15 by performing an etch step that is selective for polysilicon, thus forming a well 21 in the thick dielectric layer above each plug. The etch is allowed to proceed until the plugs are recessed at least 1,200 Å below the upper surface of the thick dielectric layer 14.

Referring now to FIG. 3, a titanium metal layer 31 is deposited on the upper surface of the wafer to a thickness of 100–500 Å using a collimated sputter source.

Referring now to FIG. 4, a titanium carbonitride layer 41 having a thickness of 100–300 Å is deposited on the upper surface of the wafer via low-pressure chemical vapor deposition (LPCVD). Although the compound is referred to as titanium carbonitride (represented by the chemical formula $TiC_xN_y$), the stoichiometry of the compound is variable depending on the conditions under which it is deposited. Its primary constituents are titanium and nitrogen, with the ratio of nitrogen to carbon being within a range of 5:1 to 20:1 for the process disclosed herein. X-Ray spectrographic analysis indicates that in these films, some of the carbon atoms have reacted with the titanium to form titanium carbide. The balance of the carbon atoms appear to be unreacted, but trapped nevertheless in the titanium nitride/titanium carbide matrix. It is hypothesized that a crystalline structure fails to form because the presence of carbon interferes with crystal nucleation.

Deposition of the titanium carbonitride layer 41 takes place in a low-pressure chamber (i.e, a chamber in which pressure has been reduced to between 0.1 and 100 Torr prior to deposition), and utilizes a metal-organic tetrakis-dialkylamido-titanium compound as the sole precursor. Any noble gas, as well as nitrogen or hydrogen, or a mixture of two or more of the foregoing may be used as a carrier for the precursor compound. The wafer is heated to a temperature within a range of 200°–600° C. Precursor molecules which contact the heated wafer are pyrolyzed to form titanium nitride containing variable amounts of carbon impurities, which deposits as a highly conformal film on the wafer. Although the carbon impurities present in the deposited films dramatically increase the sheet resistivity of the film, this increase in resistivity is relatively insignificant due to the relative thinness of the deposited layer. The carbon content of the barrier film may be minimized by utilizing tetrakis-dimethylamido-titanium, $Ti(NMe_2)_4$, as the precursor, rather than compounds such as tetrakis-diethylamido-titanium or tetrakis-dibutylamido-titanium, which contain a higher percentage of carbon by weight.

Still referring to FIG. 4, the deposited titanium carbonitride layer 41 demonstrates excellent step coverage, a high degree of conformality, and an acceptable level of resistivity. Subsequent to the deposition of the titanium carbonitride layer 41, a titanium nitride layer 42 having a thickness of 1000–2000 Å is deposited on top of the titanium carbonitride layer 41 via reactive sputtering. Titanium nitride layers deposited via reactive sputtering normally do not exhibit good step coverage. Thus, most of the deposition occurs only on horizontal surfaces.

Referring now to FIG. 5, the wafer is subjected to planarized to remove the titanium, titanium carbonitride and titanium nitride, except that which is in the recesses on top of the silicon plugs 16.

Figure 6:
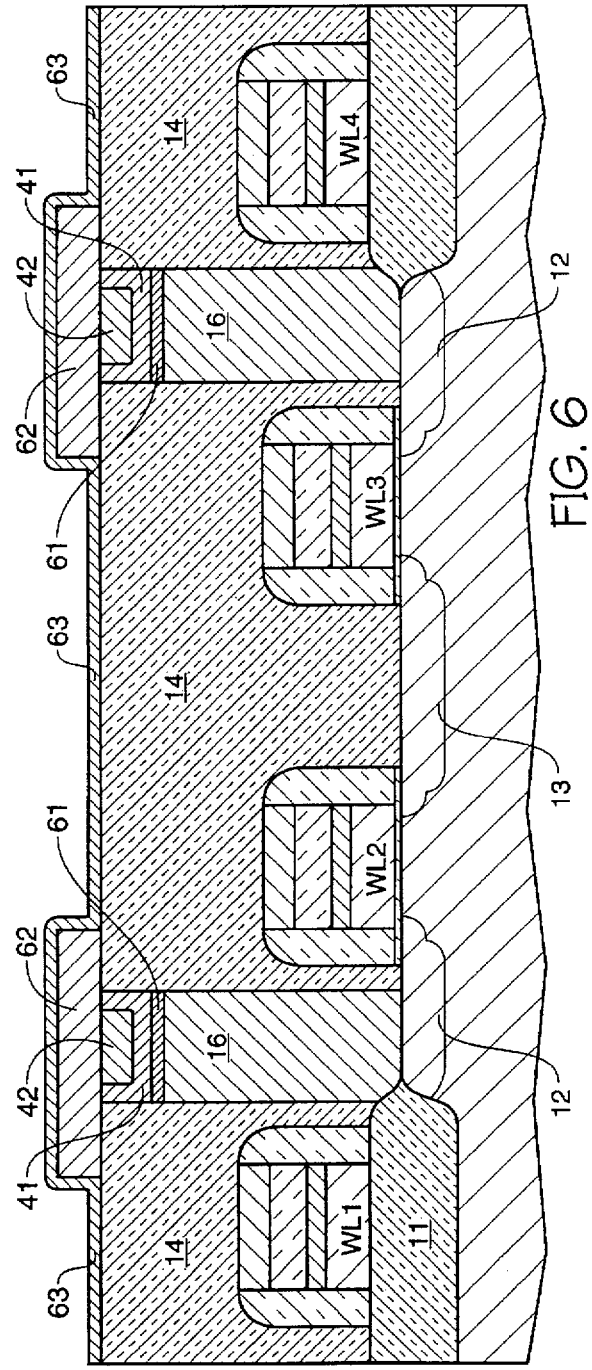
FIG. 6 is a cross-sectional view of the portion of the in-process DRAM array of FIG. 6 following the deposition and patterning of a platinum metal layer and the subsequent deposition of a high-permittivity dielectric layer.

Referring now to FIG. 6, the wafer has been subjected to an anneal step using a rapid thermal anneal system to react the titanium metal layer 31 with the silicon on the upper surfaces of the plugs 16 to form titanium silicide 61. If the silicidation reaction is not allowed to proceed to completion, there will be a titanium metal layer on top of the titanium silicide layer 61. The anneal step also repairs damage sustained by the titanium nitride layer 42 during the CMP step. Subsequent to the anneal step, a platinum metal layer is deposited on the upper surface of the wafer and patterned to form lower capacitor electrodes 62. A high permittivity capacitor dielectric layer 63 is then deposited on the upper surface of the wafer. The capacitor dielectric layer 63, which may be a perovskite oxide such as barium strontium titanate or strontium titanate, is deposited at high temperatures in an oxygen ambient. The titanium nitride layer 42 of the bi-layer barrier film that has been fabricated prevents oxygen from diffusing to the titanium carbonitride layer 41, where it would attack free carbon atoms and cause perforations in the barrier layer. Likewise, the titanium carbonitride layer 41, because it is an amorphous material without crystal grain boundaries, is able to prevent the migration of silicon atoms to the titanium nitride layer 42 through which it would be able to diffuse to reach the overlying platinum lower capacitor electrodes 62. The cell capacitors are completed by depositing an upper cell plate layer (not shown). The memory is then completed in a conventional manner.

Although only a single embodiment of the invention has been described in detail, it will be obvious to those having ordinary skill in the art of integrated circuit manufacture that changes and modifications may be made thereto without departing from the spirit and the scope of the invention as hereinafter claimed. For example, the invention may also be practiced in the context of a dynamic random access memory array having a buried bitline architecture in which bit lines (also known as digit lines) are formed after word line formation but before cell capacitor formation. Thus the general process flow depicted is meant to be only illustrative and not limiting.

What is claimed is:

1. A contact structure for use in integrated circuits, said structure comprising:
   (a) a dielectric layer overlying substrate-superjacent topography, said dielectric layer having an upper surface;
   (b) a polysilicon plug which penetrates said dielectric layer and which makes contact with a transistor junction in the substrate, said polysilicon plug having an upper surface that is recessed below the level of said dielectric layer;
   (c) a titanium silicide layer superjacent and in contact with the upper surface of the plug;
   (d) a titanium carbonitride layer superjacent and in contact with the titanium silicide layer; and
   (e) a titanium nitride layer superjacent a horizontal portion of the titanium carbonitride layer and in contact therewith.

2. The contact structure of claim 1, which further comprises a platinum layer overlying and in contact with both a portion of the dielectric layer and the titanium nitride layer.

3. The contact structure of claim 2, wherein said platinum layer is coated with a perovskite oxide layer.

4. The contact structure of claim 3, wherein said perovskite oxide layer comprises material selected from the group consisting of strontium titanate and barium strontium titanate.

5. The contact structure of claim 1, wherein said titanium nitride layer has an upper surface that is equiplanar with the upper surface of the dielectric layer.

6. The contact structure of claim 1, wherein said titanium carbonitride layer is an amorphous material having no crystal grain boundaries.

7. The contact structure of claim 1, wherein said contact structure further comprises a titanium layer between the titanium silicide layer and the titanium carbonitride layer.

8. The contact structure of claim 2, wherein said titanium nitride layer has an upper surface that is equiplanar with the upper surface of the dielectric layer.

9. The contact structure of claim 8, wherein said titanium carbonitride layer is an amorphous material having no crystal grain boundaries.

10. The contact structure of claim 1, wherein said titanium carbonitride layer comprises a predominantly amorphous material.

11. The contact structure of claim 1, wherein the top surface of said polysilicon plug is recessed at least 1,200 Å below the upper surface of said dielectric layer.

12. The contact structure of claim 1, wherein said titanium carbonitride layer has a thickness within a range of 100–300 Å.

13. The contact structure of claim 1, wherein the titanium silicide layer has a thickness within a range of 100–500 Å.

14. The contact structure of claim 1, wherein the titanium nitride layer has a thickness within a range of 1000–2000 Å.

15. A structure for making electrical contact from a conductive region in a semiconductor substrate, through a dielectric layer having an upper surface, to a superjacent capacitor having a platinum lower plate and a perovskite oxide capacitor dielectric layer overlying the lower plate, said structure comprising:
   (a) a vertically-oriented conductive polysilicon plug formed within said dielectric layer which makes electrical contact with the conductive region, said polysilicon plug having a top surface that is recessed below the upper surface of said dielectric layer;
   (c) a titanium silicide layer overlying and in contact with the top surface;
   (d) a titanium carbonitride layer overlying and in contact with the titanium silicide layer;
   (e) a titanium nitride layer superjacent a horizontal portion of the titanium carbonitride layer and in contact therewith, said titanium nitride layer also being in contact with the platinum lower capacitor plate.

16. The structure for making electrical contact of claim 15, wherein said titanium carbonitride layer comprises a predominantly amorphous material.

17. The structure for making electrical contact of claim 15, wherein the lower plate also overlies and is in contact with the upper surface of the dielectric layer.

18. The structure for making electrical contact of claim 15, wherein said titanium nitride layer has an upper surface that is equiplanar with the upper surface of the dielectric layer.

19. The structure for making electrical contact of claim 15, which further comprises a platinum layer overlying and in contact with both a portion of the dielectric layer and the titanium nitride layer.

20. The structure for making electrical contact of claim 15, wherein said perovskite oxide capacitor dielectric layer comprises material selected from the group consisting of strontium titanate and barium strontium titanate.

21. The structure for making electrical contact of claim 15, wherein the top surface of said polysilicon plug is recessed at least 1,200 Å below the upper surface of said dielectric layer.

22. The structure for making electrical contact of claim 15, wherein said titanium carbonitride layer has a thickness within a range of 100–300 Å.

23. The structure for making electrical contact of claim 15, wherein the titanium silicide layer has a thickness within a range of 100–500 Å.

24. The structure for making electrical contact of claim 15, wherein the titanium nitride layer has a thickness within a range of 1000–2000 Å.

25. A structure for making electrical contact from a conductive region in a semiconductor substrate, through a dielectric layer overlying the substrate and having an upper surface, to a platinum layer overlying the dielectric layer, said structure comprising:
   (a) a vertically-oriented conductive polysilicon plug formed within said dielectric layer which makes electrical contact with the conductive region, said polysilicon plug having a top surface that is recessed below the upper surface of said dielectric layer;
   (c) a titanium silicide layer overlying and in contact with the top surface;
   (d) a titanium carbonitride layer overlying and in contact with the titanium silicide layer;
   (e) a titanium nitride layer overlying at least a horizontal portion of the titanium carbonitride layer and in contact therewith, said titanium nitride layer also being in contact with the platinum layer.

26. The structure for making electrical contact of claim 25, wherein said titanium carbonitride layer comprises a predominantly amorphous material.

27. The structure for making electrical contact of claim 25, wherein said titanium nitride layer has an upper surface that is equiplanar with the upper surface of the dielectric layer.

28. The structure for making electrical contact of claim 25, wherein said platinum layer is one plate of a capacitor.

29. The structure for making electrical contact of claim 28, wherein said capacitor has a capacitor dielectric layer that is predominantly a perovskite oxide selected from the group consisting of barium strontium titanate and strontium titanate.

* * * * *

UNITED STATES PATENT AND TRADEMARK OFFICE
CERTIFICATE OF CORRECTION

PATENT NO.   : 5,717,250
DATED        : February 10, 1998
INVENTOR(S)  : Paul J. Schuele and Pierre C. Fazan It is certified that error appears in the above-identified patent and that said Letters Patent is hereby corrected as shown below:

<u>Title page, Item [54] and Column 1, lines 1-2,</u>
Change "SPUTTER AND CVD DEPOSITED TITANIUM NITRIDE BARRIER LAYER" to -- CONTACT STRUCTURE HAVING A COMPOSITE BARRIER LAYER STACK --

<u>Column 4,</u>
Line 26, change "planarized" to -- planarization --
Line 28, change "silicon" to -- polysilicon --

Signed and Sealed this

Third Day of February, 2004

JON W. DUDAS
*Acting Director of the United States Patent and Trademark Office*